United States Patent
Ouyang et al.

(10) Patent No.: US 9,791,899 B2
(45) Date of Patent: Oct. 17, 2017

(54) METHOD TO REALIZE RECONFIGURABLE MEMORY TOPOLOGY

(71) Applicant: Intel Corporation, Santa Clara, CA (US)

(72) Inventors: Gong Ouyang, Olympia, WA (US); Kai Xiao, University Place, CA (US); Lu-Vong Phan, DuPont, WA (US)

(73) Assignee: INTEL CORPORATION, Santa Clara, CA (US)

( * ) Notice: Subject to any disclaimer, the term of this patent is extended or adjusted under 35 U.S.C. 154(b) by 120 days.

(21) Appl. No.: 14/968,698

(22) Filed: Dec. 14, 2015

(65) Prior Publication Data

US 2017/0168528 A1  Jun. 15, 2017

(51) Int. Cl.
| | | |
|---|---|---|
| *G06F 1/18* | (2006.01) | |
| *H05K 1/18* | (2006.01) | |
| *H05K 3/22* | (2006.01) | |
| *G06F 1/16* | (2006.01) | |

(52) U.S. Cl.
CPC ............ *G06F 1/185* (2013.01); *G06F 1/1616* (2013.01); *G06F 1/1637* (2013.01); *G06F 1/1681* (2013.01); *H05K 1/181* (2013.01); *H05K 3/222* (2013.01)

(58) Field of Classification Search
CPC ............................... H05K 1/181; H05K 3/222
See application file for complete search history.

(56) References Cited

U.S. PATENT DOCUMENTS

| | | | |
|---|---|---|---|
| 6,233,157 B1 | 5/2001 | Yoon et al. | |
| 6,739,879 B2 | 5/2004 | Sprietsma et al. | |
| 7,113,418 B2 | 9/2006 | Oberlin et al. | |
| 7,446,410 B2 * | 11/2008 | Wehrly, Jr. ............. | H05K 1/189 257/707 |
| 8,031,504 B2 | 10/2011 | Chen | |
| 8,735,735 B2 | 5/2014 | Palm et al. | |
| 2002/0056018 A1 * | 5/2002 | Schumacher ....... | G06F 13/4086 710/300 |

OTHER PUBLICATIONS

Notification of Transmittal of the International Search Report and the Written Opinion of the International Searching Authority issued for International Patent Application No. PCT/US2016/057027, mailed Jan. 25, 2017.

* cited by examiner

*Primary Examiner* — Adrian S Wilson
(74) *Attorney, Agent, or Firm* — Blakely Sokoloff Taylor and Zafman LLP (57) ABSTRACT

An apparatus and method to permit reconfiguration of a memory topology. A printed circuit board (PCB) has a central processing unit (CPU) connector coupled a pair of dual inline memory module (DIMM) connectors coupled thereto. The PCB defines an electrical access channel coupling the pair of DIMM connectors into a T topology having a first branch and a second branch. The second branch of the T topology is electrically discontinuous with the rest of the T topology proximate to a T junction. A bridge may be provided to span the discontinuity.

22 Claims, 7 Drawing Sheets

//METHOD TO REALIZE RECONFIGURABLE MEMORY TOPOLOGY

BACKGROUND

Field

Embodiments of the invention relate to memory access. More specifically, embodiments of the invention relate to memory access in a T type memory topology for dual inline memory modules.

Background

There are two popular types of memory topologies commonly used with dual inline memory modules (DIMM): daisy chain topologies, and T type topologies. Daisy chain topologies generally provide inferior performance to T type topologies where two DIMMs exist per channel especially when performing a read from or write to the closest DIMM. This is due to the signal distortion as a result from the reflection between the two DIMMs. With T type topologies, it is important to have balanced loads on each branch of the T. However, some systems exhibit a T topology that leaves one DIMM slot unloaded. This results in a stub and as a result, reflections on the stub. Such reflection seriously degrades signal integrity and, as a result, the memory interface may need to operate at a lower speed, which will reduce the memory bandwidth. It may be possible to mitigate this effect by installing a dummy load card in the unpopulated DIMM slot. To be effective, this would require dummies matching loads of the various possible DIMMs installed in the other slot.

BRIEF DESCRIPTION OF THE DRAWINGS

Embodiments of the invention are illustrated by way of example and not by way of limitation in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
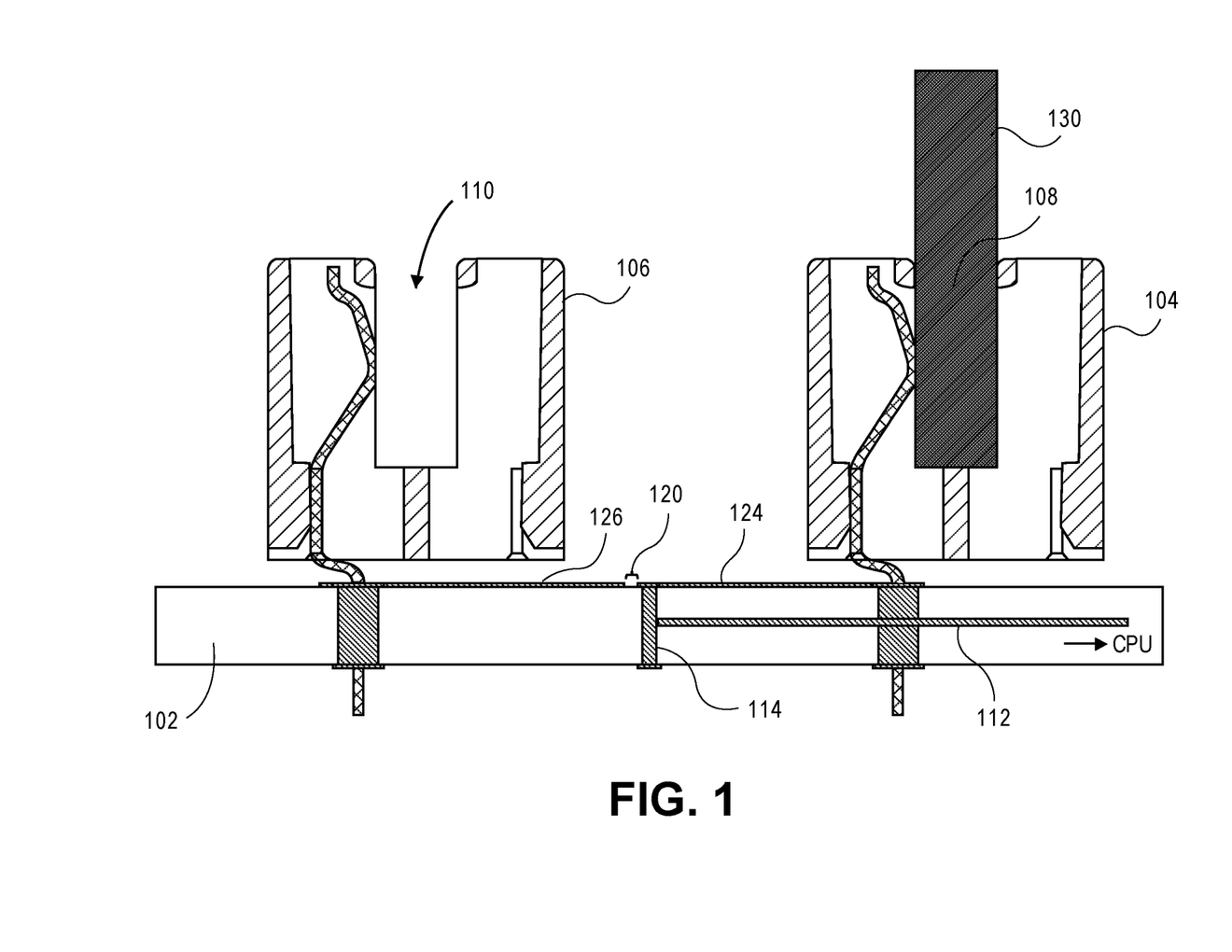
FIG. 1 is a diagram of a schematic view according to one embodiment of the invention.

FIG. 1 is a diagram of a schematic view according to one embodiment of the invention. A printed circuit board (PCB) 102 has a first dual inline memory module (DIMM) connector 104 coupled thereto. Connector 104 has a slot 108, which is shown populated by a DIMM 130. A second connector 106 is coupled to PCB 102 and has a slot 110 that is shown unpopulated.

The two DIMM slots are coupled to a central processing unit (CPU) (not shown) via a T topology. The T topology includes a CPU signal path 112 (shown as embedded within PCB 102), which is in electrical communication with via 114. Commonly, the via that forms the central pillar (or junction point) of the T topology is referred to as a transition via. Via 114 is electrically continuous with a first branch of the T topology 124 that provides a signal path to first DIMM connector 104. A second branch 126 is electrically discontinuous with via 114 as a result of a gap 120 between via 114 and second branch 126. It is desirable that the gap 120 be very close to via 114 to reduce stub effects. Branch 126 is electrically coupled to second DIMM slot 106. While the gap 120 is left open, the CPU can access DIMM 130 as though it were a point-to-point link without suffering the consequences of traditional T topologies having an unloaded branch. As explained below, embodiments of the invention provide a removable bridge to span gap 120 for systems where both slots 108 and 110 will be populated. In FIG. 1, first branch 124 and second branch 126 are shown as traces on the surface of PCB 102. Thus, contact points for the first and second branch are exposed on the surface of the board in such embodiments. In some embodiments, the contact points can be enlarged with solder ball to improve connection with the bridging mechanisms described below.

Figure 2A:
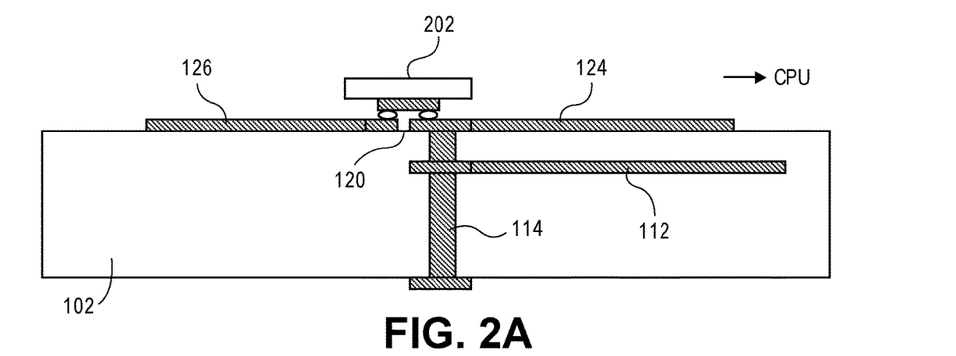
FIGS. 2A-2C show bridging the discontinuity in a T topology according to various embodiments of the invention.
Figure 2B:
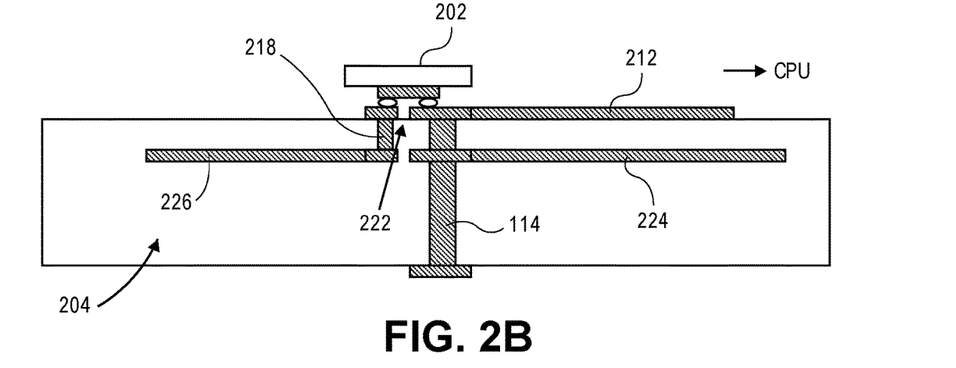
Figure 2C:
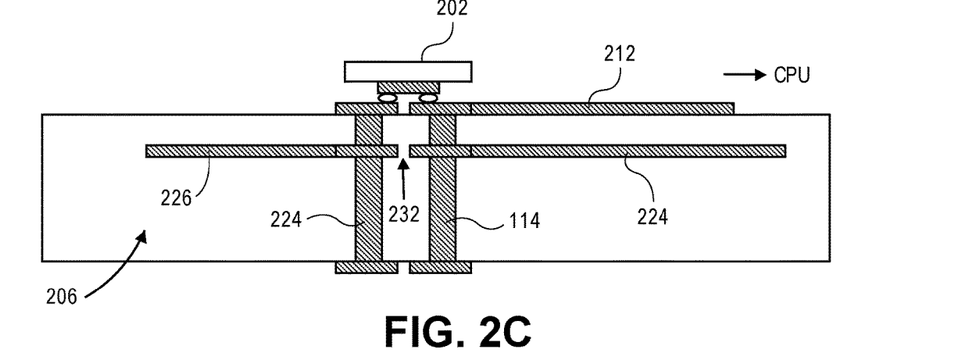

FIGS. 2A-2C show bridging the discontinuity in a T topology according to various embodiments of the invention. In FIG. 2A, the embodiment of FIG. 1 is shown where both DIMM slots are populated. In such an embodiment, a removable bridge 202 is installed to span the gap 120 to ensure a continuous electrical path from via 114 into branch 126. Because the gap 120 is small, typically less than 10 thousandth of an inch, the incremental load different between the two paths does not cause significant degradation. The CPU accesses either memory module along its access path 112, achieving the benefits of the higher speeds of the T topology.

Removable bridge 202 can be formed in various way for various embodiments of the invention. In some embodiments, it may include a shorting pad that is clamped to the PCB 102 to short between the contact points. In other embodiment the bridge 202 may be a direct printing on the PCB 102 with conductive ink. The ink can be erases if only one slot is to be populated. In other embodiments, a conductive adhesive tape may be used to bridge the gap. By using an aggressive adhesive, the bridge contact with the exposed contact point and therefore signal path on the second branch can be assured. Some embodiments, use a Micro-Electro-Mechanical Systems (MEMS) switch on a dielectric layer attached to the PCB 102 to span the gap. For example, the dielectric with the MEMS can be soldered to the PCB 102. When the switch is open the second branch is discontinuous with the T topology and when the switch is closed the branch is continuous with the T topology. MEMS switches generally require relatively high voltages to operate the switch. In other embodiments, a metallic particle interconnect (MPI) socket may be used to couple the bridge device 202 and the PCB 102. The MPI socket is held with pressure against the PCB 102 and the bridge device 202 to make sure the coupling is reliable. MPI connector vendors can easily make a custom MPI matching the pattern of exposed connection points. MPI permits a high density contact on the order of 16 thousandths of an inch which is sufficient of the bridging requirements. Other mechanism for spanning the gap are also within the scope of embodiments of the invention.

In FIG. 2B, an alternative embodiment is shown which the T topology branches are embedded in the PCB 102. Thus, first branch 224 is electrically continuous with via 114, but is not itself exposed on the surface of the PCB. CPU signal path 212 is, in this embodiment, shown as a trace on the surface of PCB 204. Second branch 226 is electrically discontinuous with via 114, and also embedded within the PCB. To provide access to permit bridging, a micro-via (or blind via) 218 is used to provide an exposed contact point on the surface of PCB 204. The gap 222 between the exposed micro-via (or blind via) 218 and via 114 is spanned by removable bridge 202. Any of the various types of bridges described above may alternatively be used in conjunction with micro-via (or blind via) 218 and via 114.

FIG. 2C shows yet another embodiment in which CPU signal path 212 is a trace on the surface of the PCB, and first and second branches 224 and 226, respectively, are embedded in the PCB 206. In this embodiment, branch 226 is electrically continuous with via 224, while first branch 224 is electrically continuous with first via 114. Both vias are electrical contact points on the surface of the PCB 206, and bridge 202 spans the gap 232 between the vias. The vias may be approximately 25 thousandth of an inch apart within the PCB, and gap 232 will typically be less than 10 thousandth of an inch. Any of the various types of bridges described above may alternatively be used in conjunction with via 224 and via 114.

Figure 3A:
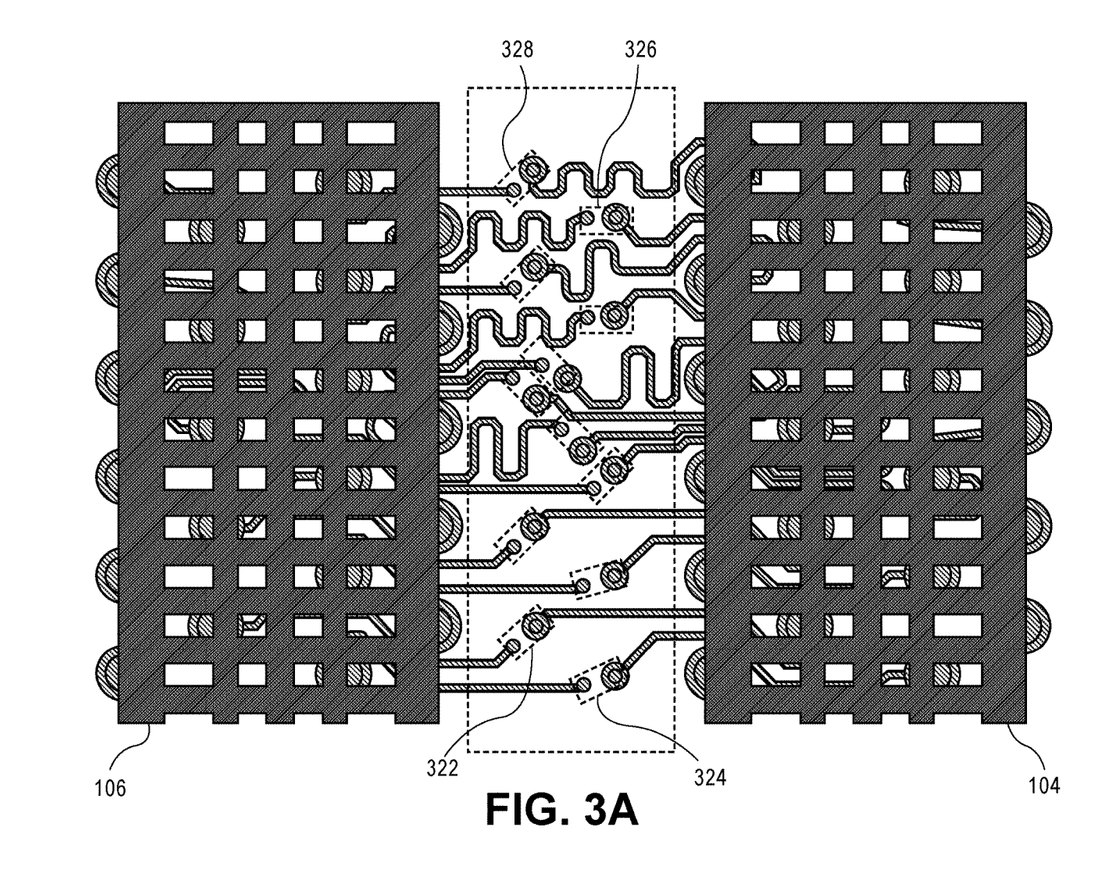
FIGS. 3A and 3B show schematics of DIMM connectors and a shorting pad used to form the T topology according to one embodiment of the invention.
Figure 3B:
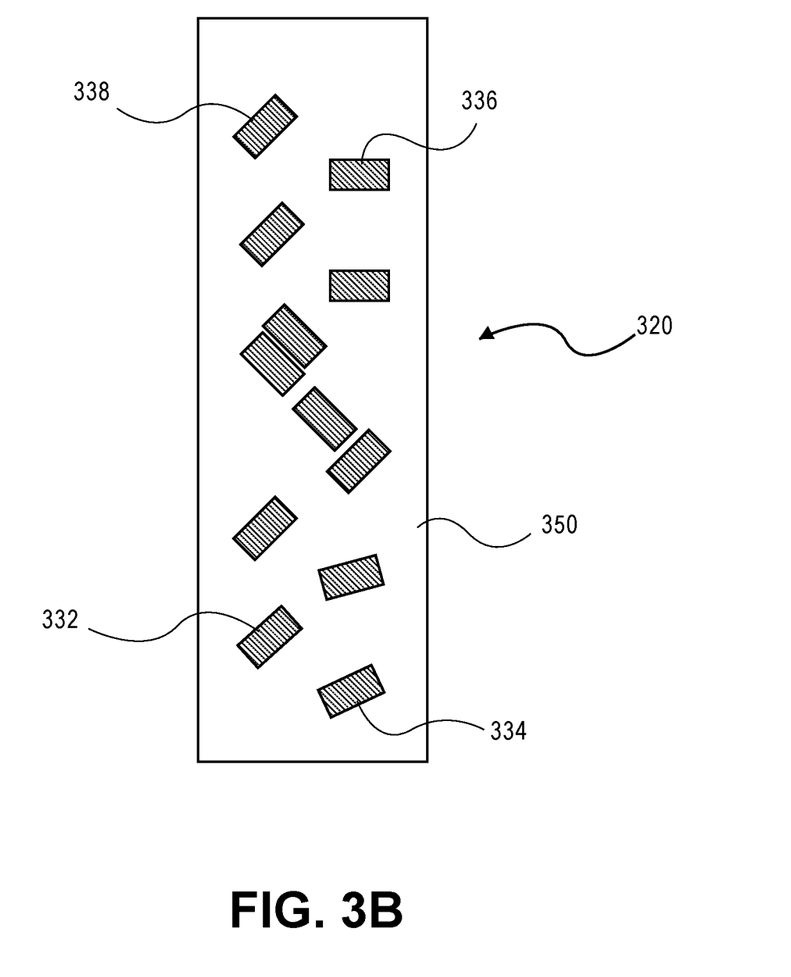

FIGS. 3A and 3B show schematics of DIMM connectors and a shorting pad used to form the T topology according to one embodiment of the invention. A pair of DIMM connectors 104 and 106 (only the connector housings are shown) are electrically disconnected as a result of gaps near the junction of the T topology with which they are associated; for example, gaps 322, 324, 326 and 328. In the FIG. 3A, these and other gaps are shown as dotted boxes enclosing the exposed connection points. FIG. 3B shows the shorting pad 320, which is a dielectric layer 350 with a metal layer bonded thereon. In one embodiment, a copper layer is etched into many patches on the dielectric layer 350. In this way, a copper shorting pad exists corresponding to each gap in the T topology. In some embodiments, the copper may be gold/nickel plated to improve the conductivity of the shorting pad. Here, pad 332 corresponds to gap 322, pad 334 to gap 324, pad 336 to gap 326, and pad 338 to gap 328. Each of the other unnumbered gaps has a corresponding unnumbered pad. When pad 320 is held in place, a secure electrical contact exists. In this way, a proper T topology for DIMM slots 104 and 106 is created.

Figure 4A:
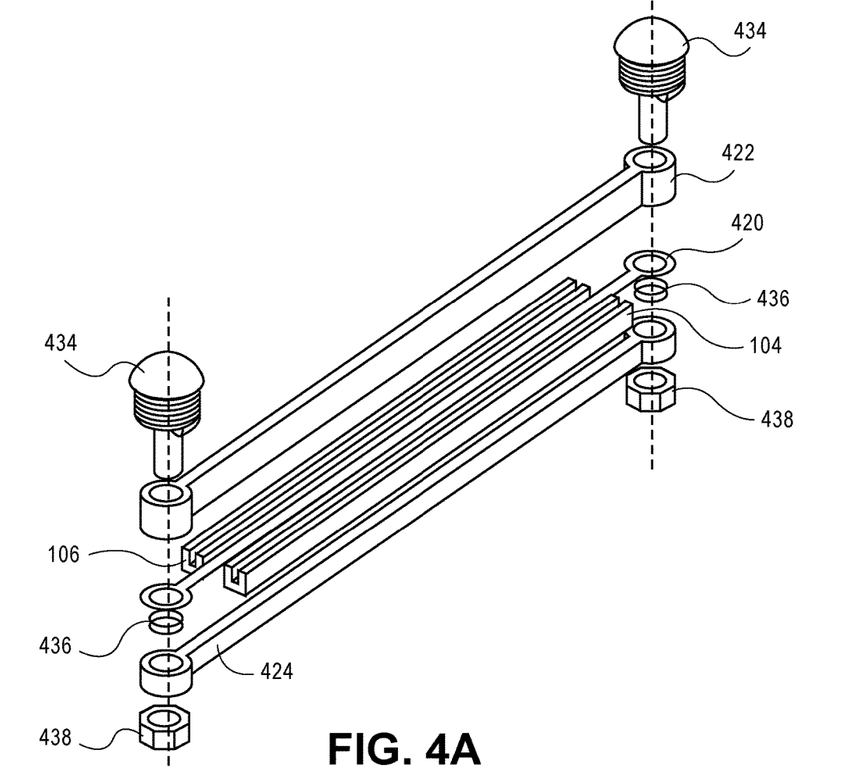
FIGS. 4A and 4B show a loading mechanism for bridge device installation on the board in the T topology of one embodiment of the invention.
Figure 4B:
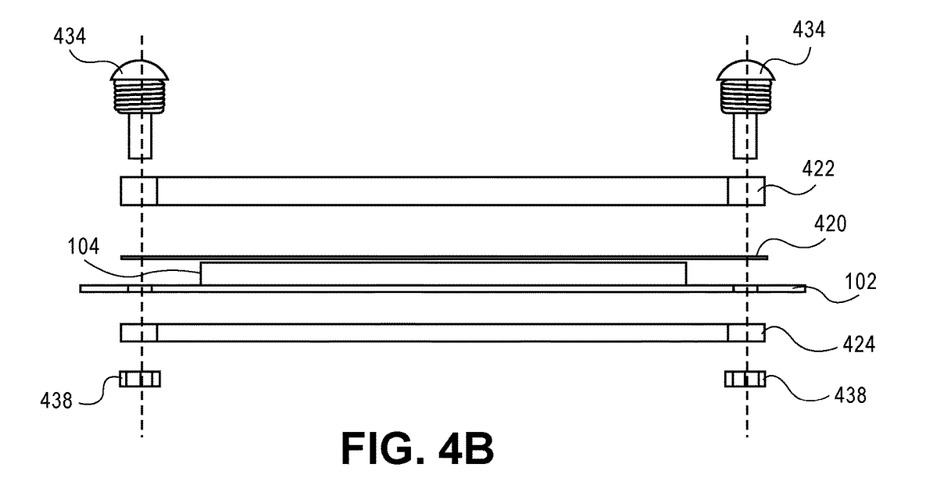

FIGS. 4A and 4B show a loading mechanism for bridge device installation in the T topology of one embodiment of the invention. FIG. 4A shows a perspective view of the bridge loading mechanism exploded between two DIMM slots 104 and 106. A shorting pad 420 is held in place by a clamp 422. Spring screws 434 that pass through holes 436 in the PCB and engages nut 438 on the opposite side hold clamp 422 in place. Preferably, a back plate 424 having substantially the same footprint as clamp 422 is installed on the back side of the PCB 102 between the nut 438 and the PCB 102 to reduce risks of warping as a result of attachment of the clamp 422. In some embodiments clamp 422 and Back plate 424 may be made of metal. In other embodiments, other rigid materials such as glass-reinforced composites may be used. FIG. 4B shows an exploded side view of the bridge of FIG. 4A. Spring screws 434 pass through clamp 422 and shorting path 420 through PCB 102 and back plate 424 to be retained by nuts 438. The entire bridge is disposed between DIMM slots 104 and DIMM slot 106 (not shown in FIG. 4B). It is possible to have an additional shorting pad (bridge) between back plate 424 and PCB 102 if there are gaps to span on the bottom side. While this shorting pad is shown as having a "random" conductive distribution that would require a custom design, some embodiment may have a uniform distribution of contact point that would permit a standard bridge or shorting pad. In some embodiments, a plurality of individual bridges may be used to short the gaps between all of the contact on a memory channel.

Figure 5:
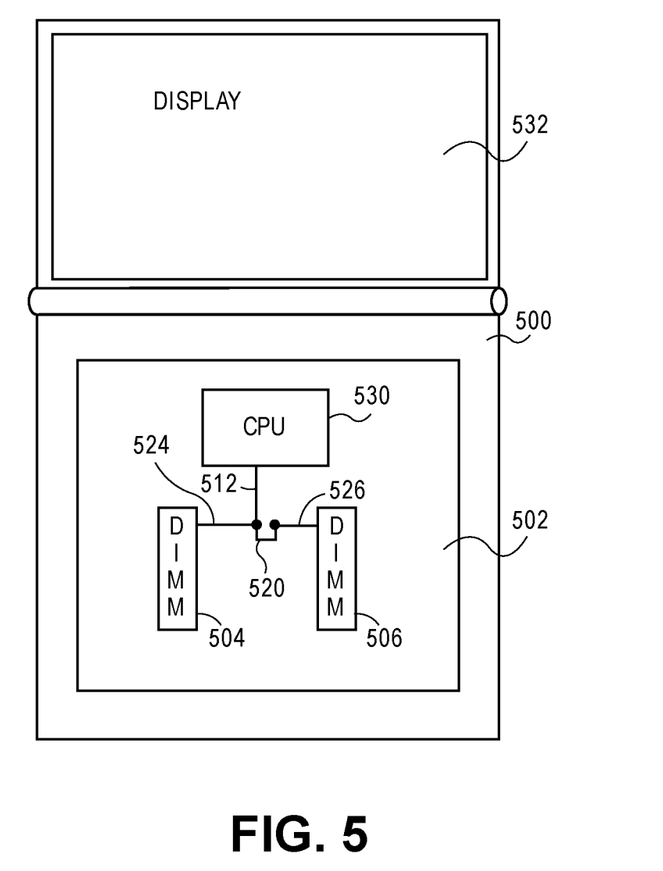
FIG. 5 is a block diagram of a system according to one embodiment of the invention.

FIG. 5 is a block diagram of a system according to one embodiment of the invention. Mobile platform 500 includes a display 532 and a motherboard 502. Mobile platform 500 may be a smartphone, a tablet, a laptop computer, a personal digital assistant (PDA), an e-reader, or the like. Motherboard 502 has a CPU socket for a CPU 530 that is coupled to a pair of DIMM slots 504 and 506 to be populated with DIMM modules. "Socket" as used here in includes connectors, surface mounts and the like. The T topology includes signal path 512, first branch 524 and second branch 526. A removable bridge 520 is provided to bridge a gap between first branch 524 and second branch 526. Manufacturers of motherboard 520 may elect to include the removable bridge, which may then be removed by system manufacturers in the event that only one of the DIMM slots is populated, or, the motherboard 520 may be provided without the bridge 520 installed and permit system integrators to add the bridge 520 in the event that a system with both DIMM slots populated is desired.

Figure 6:
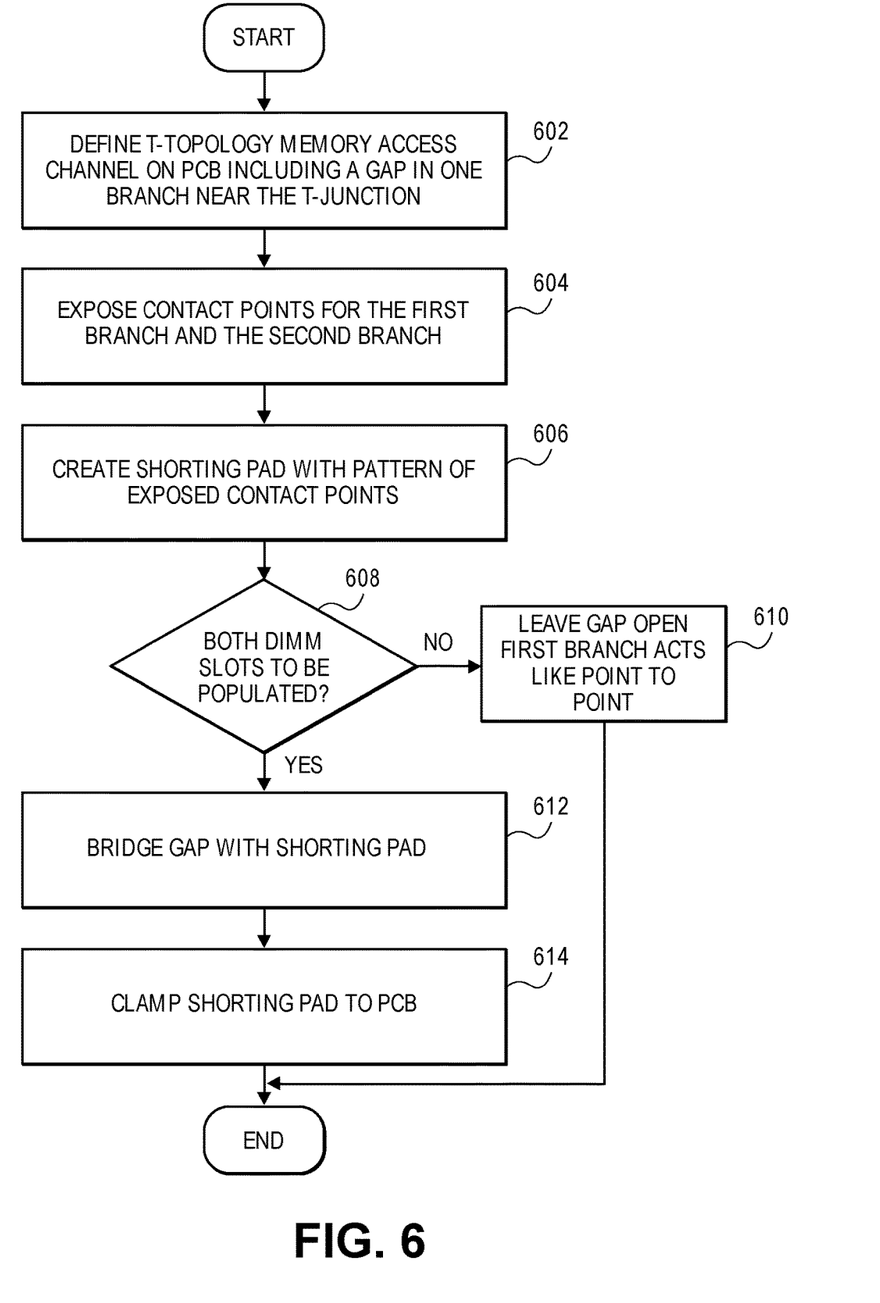
FIG. 6 is a flow diagram of organization of the T topology according to one embodiment of the invention.

FIG. 6 is a flow diagram of organization of the T topology according to one embodiment of the invention. At block 602, a T topology memory access channel is defined on a PCB including a gap in one branch near the T junction. At block 604, contact points for the first and second branch are exposed on the surface of the PCB. At block 606, a shorting pad is created with the pattern of exposed contact points. At decision block 608, a determination is made if both DIMM slots are to be populated. If both DIMM slots are not intended to be populated, at block 610 the gap is left open so that the first branch acts like a point-to-point link, unencumbered by the second branch of the T topology. If both DIMM slots are to be populated, at block 612 the gaps are bridged with the shorting pad. Then, at block 614, the shorting pad is clamped to the PCB to ensure quality connection down both branches of the T topology.

The following examples pertain to further embodiments. The various features of the different embodiments may be variously combined with some features included and others excluded to suit a variety of different applications. Some embodiments pertain an apparatus to permit reconfiguration of a memory topology. A printed circuit board (PCB) has a central processing unit (CPU) socket with a pair of dual inline memory module (DIMM) connectors coupled thereto. The PCB defines an electrical access channel coupling the pair of DIMM connectors into a T topology having a first branch and a second branch. The second branch of the T topology is electrically discontinuous with the rest of the T topology proximate to a T junction.

In further embodiments, a removable bridge is used to span a gap in the second branch to restore electric continuity.

In further embodiments, the channel has a via in the PCB with an electrically continuous first branch on the surface of the PCB. The second branch on the surface of the PCB defines a gap adjacent to the via. The channel has a conductive path between the via and the CPU socket.

In further embodiments, the channel has a via in the PCB with an electrically continuous first branch within the PCB. A micro-via (or blind via) adjacent to the via, but electrically discontinuous with the via is coupled to a second branch within the PCB. The channel has a conductive path between the via and the CPU socket.

In further embodiments, the channel has a first via in the PCB with art electrically continuous first branch embedded within the PCB. A second via is adjacent to the first via, but electrically discontinuous with the first via and is coupled to a second branch embedded within the PCB. The channel has a conductive path between the first via and the CPU socket.

In further embodiments, the bridge includes a shorting pad and a clamp to couple the shorting pad to the PCB. The bridges could include conductive adhesive to span the gap. The bridges could include conductive ink printed on the PCB and spanning the gap. The bridges could include a metallic particle interconnect spanning the gap. The bridges could include a MEMS switch that spans the gap when the switch is closed.

In further embodiments, the bridge includes a back plate to support a side of the PCB opposite the clamp.

Some embodiments pertain to a method including defining a memory access channel on a printed circuit board (PCB), the memory access channel having a T topology having a first branch electrically continuous with a junction of the T and a second branch electrically discontinuous with the junction of the T. The method includes exposing contact points for both the first and second branch on a surface of the PCB. The method also includes coupling a first DIMM slot and a second DIMM slot to the first branch and second branch respectively on the PCB. A removable bridge is provided to span between the exposed contact points.

Further embodiments, include installing the bridge responsive to a decision to populate both DIMM slots.

In further embodiments, providing includes applying a metal shorting pattern to a dielectric layer to create a shorting pad.

In further embodiments, installing includes clamping a shorting pad to the exposed contact points.

In further embodiments, the first and second branches are traces on a surface of the PCB wherein a via is the junction. The method includes defining an electrical path to a central processing unit within the PCB and electrically continuous with the via.

In further embodiments, the first and second branches are embedded within the PCB. Exposing includes electrically coupling the first branch to a via exposed on a surface of the PCB and electrically coupling the second branch to a micro-via (or blind via) exposed on the surface of the PCB adjacent to the via.

In further embodiments, the first and second branch are embedded within the PCB. Exposing includes electrically coupling the first branch to a first via exposed on the surface of the PCB and electrically coupling the second branch to a second via exposed on the surface of the PCB and adjacent to the first via.

In further embodiments, the method includes removing the bridge responsive to a decision to populate only a first DIMM slot.

Some embodiments pertain to a mobile system with a reconfigurable memory topology. A mobile platform includes a display. A motherboard resides within the mobile platform and has a first and second dual inline memory module (DIMM) slot. A central processing unit (CPU) is coupled through the motherboard to the DIMM slots in a T topology. A first branch of the T topology is electrically continuous between the T junction and the first DIMM slot. The second branch defines a gap proximate to the T junction such that the second branch is electrically discontinuous between the T junction and the second DIMM slot.

In further embodiments, a bridge coupled to the motherboard electrically spans the gap.

In further embodiments, the bridge includes a shorting pad and a clamp.

In further embodiments, the bridge includes a back plate to support a side of the motherboard opposite the clamp.

In further embodiments, the topology has a via in the motherboard with a first branch on the surface of the mother board electrically continuous with the via. The topology also has a second branch on the surface of the PCB defining a gap adjacent to the via and a conductive path between the via and the CPU.

In further embodiments, the topology has a via with a first branch within the motherboard electrically continuous with the via. The topology also has a micro-via (or blind via) adjacent to the via, but electrically discontinuous with the via with a second branch within the motherboard electrically continuous with the micro-via (or blind via). A conductive path between the via and the CPU is defined on the motherboard.

In further embodiments, the topology has a first via with a first branch within the motherboard electrically continuous with the first via. The topology also has a second via adjacent to the first via, but electrically discontinuous with the first via with a second branch within the motherboard electrically continuous with the second via. A conductive path between the via and the CPU is defined on the motherboard.

Some embodiments pertain to an apparatus to permit memory reconfiguration in a T topology. Means for defining a T topology between a central processing unit and a pair of dual inline memory module (DIMM) slots, the T topology having a first branch electrically continuous with a junction of the T and a second branch electrically discontinuous with the junction of the T and means for bridging an electric discontinuity in the second branch are provided.

In further embodiments, the electric discontinuity is a physical gap in the signal path of the second branch.

In further embodiments, means for bridging includes a shorting pad and a clamp.

While embodiments of the invention are discussed above in the context of flow diagrams reflecting a particular linear order, this is for convenience only. In some cases, various operations may be performed in a different order than shown or various operations may occur in parallel. It should also be recognized that some operations described with respect to one embodiment may be advantageously incorporated into another embodiment. Such incorporation is expressly contemplated.

In the foregoing specification, the invention has been described with reference to the specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. An apparatus to permit reconfiguration of a memory topology comprising:
   a printed circuit board (PCB);
   a central processing unit (CPU) socket coupled to the PCB;
   a pair of dual inline memory module (DIMM) connectors coupled to the PCB;

an electrical access channel defined by the PCB coupling the pair of DIMM connectors into a T topology having a first branch and a second branch, wherein the second branch of the T topology is electrically discontinuous proximate to a T junction.

2. The apparatus of claim 1, further comprising:
a removable bridge to span a gap in the second branch to restore electric continuity.

3. The apparatus of claim 1, wherein the channel comprises:
a via in the PCB;
a first branch on the surface of the PCB electrically continuous with the via;
a second branch on the surface of the PCB defining a gap adjacent to the via; and
a conductive path between the via and the CPU socket.

4. The apparatus of claim 1, wherein the channel comprises:
a via;
a first branch within the PCB electrically continuous with the via;
one of a micro-via and a blind via adjacent to the via, but electrically discontinuous with the via;
a second branch within the PCB electrically continuous with the micro-via; and
a conductive path between the via and the CPU socket.

5. The apparatus of claim 1, wherein the channel comprises:
a first via;
a first branch embedded within the PCB electrically continuous with the first via;
a second via adjacent to the first via and electrically discontinuous with the first via;
a second branch embedded within the PCB and electrically continuous with the second via; and
a conductive path between the first via and the CPU socket.

6. The apparatus of claim 2, wherein the bridge comprises one of:
a shorting pad and a clamp to couple the shorting pad to the PCB;
conductive adhesive to span the gap;
conductive ink printed on the PCB and spanning the gap;
a metallic particle interconnect spanning the gap; or
a MEMS switch that spans the gap when the switch is closed.

7. The apparatus of claim 6, wherein the bridge further comprises:
a back plate to support a side of the PCB opposite the clamp.

8. A method comprising:
defining a memory access channel on a printed circuit board (PCB), the memory access channel having a T topology having a first branch electrically continuous with a junction of the T and a second branch electrically discontinuous with the junction of the T;
exposing contact points for both the first and second branch on a surface of the PCB;
coupling a first DIMM slot to the first branch on the PCB;
coupling a second DIMM slot to the second branch on the PCB; and
providing a removable bridge to electrically connect between the exposed contact points.

9. The method of claim 8, further comprising installing the bridge responsive to a decision to populate both DIMM slots.

10. The method of claim 8, wherein providing comprises:
applying a metal shorting pattern to a dielectric layer to create a shorting pad.

11. The method of claim 9, wherein installing comprises:
clamping a shorting pad to the exposed contact points.

12. The method of claim 8, wherein the first and second branches are traces on a surface of the PCB wherein a via is the junction, the method further comprising:
defining an electrical path to a central processing unit within the PCB and electrically continuous with the via.

13. The method of claim 8, wherein the first and second branches are embedded within the PCB, and wherein exposing comprises:
electrically coupling the first branch to a via exposed on a surface of the PCB; and
electrically coupling the second branch to one of a micro-via and a blind via exposed on the surface of the PCB adjacent to the via.

14. The method of claim 8, wherein the first and second branch are embedded within the PCB, and wherein exposing comprises:
electrically coupling the first branch to a first via exposed on the surface of the PCB; and electrically coupling the second branch to a second via exposed on the surface of the PCB and adjacent to the first via.

15. The method of claim 8, further comprising:
removing the bridge responsive to a decision to populate only a first DIMM slot.

16. A mobile system with a reconfigurable memory topology comprising:
a mobile platform including a display;
a motherboard within the mobile platform having a first and second dual inline memory module (DIMM) slot;
a central processing unit (CPU) coupled through the motherboard to the DIMM slots in a T topology;
wherein a first branch of the T topology is electrically continuous between a T junction and the first DIMM slot, and a second branch defines a gap proximate to the T junction such that the second branch is electrically discontinuous between the T junction and the second DIMM slot.

17. The system of claim 16, further comprising:
a bridge coupled to the motherboard electrically spanning the gap.

18. The system of claim 16, wherein the bridge comprises:
a shorting pad; and
a clamp.

19. The system of claim 18, wherein the bridge further comprises:
a back plate to support a side of the motherboard opposite the clamp.

20. The system of claim 16, wherein the topology comprises:
a via in the motherboard;
a first branch on the surface of the motherboard electrically continuous with the via;
a second branch on the surface of the motherboard defining a gap adjacent to the via; and
a conductive path between the via and the CPU.

21. The system of claim 16, wherein the topology comprises:
a via;
the first branch within the motherboard electrically continuous with the via;
one of a micro-via and a blind via adjacent to the via, but electrically discontinuous with the via;

the second branch within the motherboard electrically continuous with the socket-via or blind via; and a conductive path between the via and the CPU.

22. The system of claim 16, wherein the topology comprises:

a first via;

the first branch embedded within the motherboard electrically continuous with the first via;

a second via adjacent to the first via and electrically discontinuous with the first via;

the second branch embedded within the motherboard and electrically continuous with the second via; and a conductive path between the first via and the CPU.

\* \* \* \* \*